United States Patent [19]

Lidgard et al.

[11] Patent Number: 5,003,546
[45] Date of Patent: Mar. 26, 1991

[54] INTERFEROMETRIC DEVICES FOR REDUCING HARMONIC DISTORTIONS IN LASER COMMUNICATION SYSTEMS

[75] Inventors: Anne I. Lidgard, New Providence; Nils A. Olsson, Gillette, both of N.J.

[73] Assignee: AT&T Bell Laboratories, Murray Hill, N.J.

[21] Appl. No.: 401,204

[22] Filed: Aug. 31, 1989

[51] Int. Cl.[5] .............................................. H01S 3/10
[52] U.S. Cl. ...................................... 372/26; 372/28; 372/30; 372/29; 356/345; 356/346
[58] Field of Search ................. 372/26, 29, 28, 30–33, 372/19–20, 16; 356/301, 345, 346, 372

[56] References Cited

U.S. PATENT DOCUMENTS 4,101,847  7/1978  Albanese ............................ 331/95.5
4,561,119 12/1985  Epworth ................................ 372/26
4,847,477  7/1989  Smith ................................... 372/29

Primary Examiner—Georgia Epps
Attorney, Agent, or Firm—David I. Caplan

[57] ABSTRACT

In an optical communication system, in order to reduce simultaneously both second and third harmonic distortion in a light beam from a modulated semiconductor laser, a nonlinear interferometric deivce—such as a Fabry-Perot etalon—is inserted in the path of the beam. The parameters of the interferometric device—such as its phase and finesse—are selected such that, for a suitable laser bias current, the second and third harmonics produced by nonlinearities of the laser (plus nonlinearities of the transmission medium such as an optical fiber, if any, through which the beam propagates from source to receiver) are significantly compensated by nonlinearities of the interometric device.

8 Claims, 2 Drawing Sheets

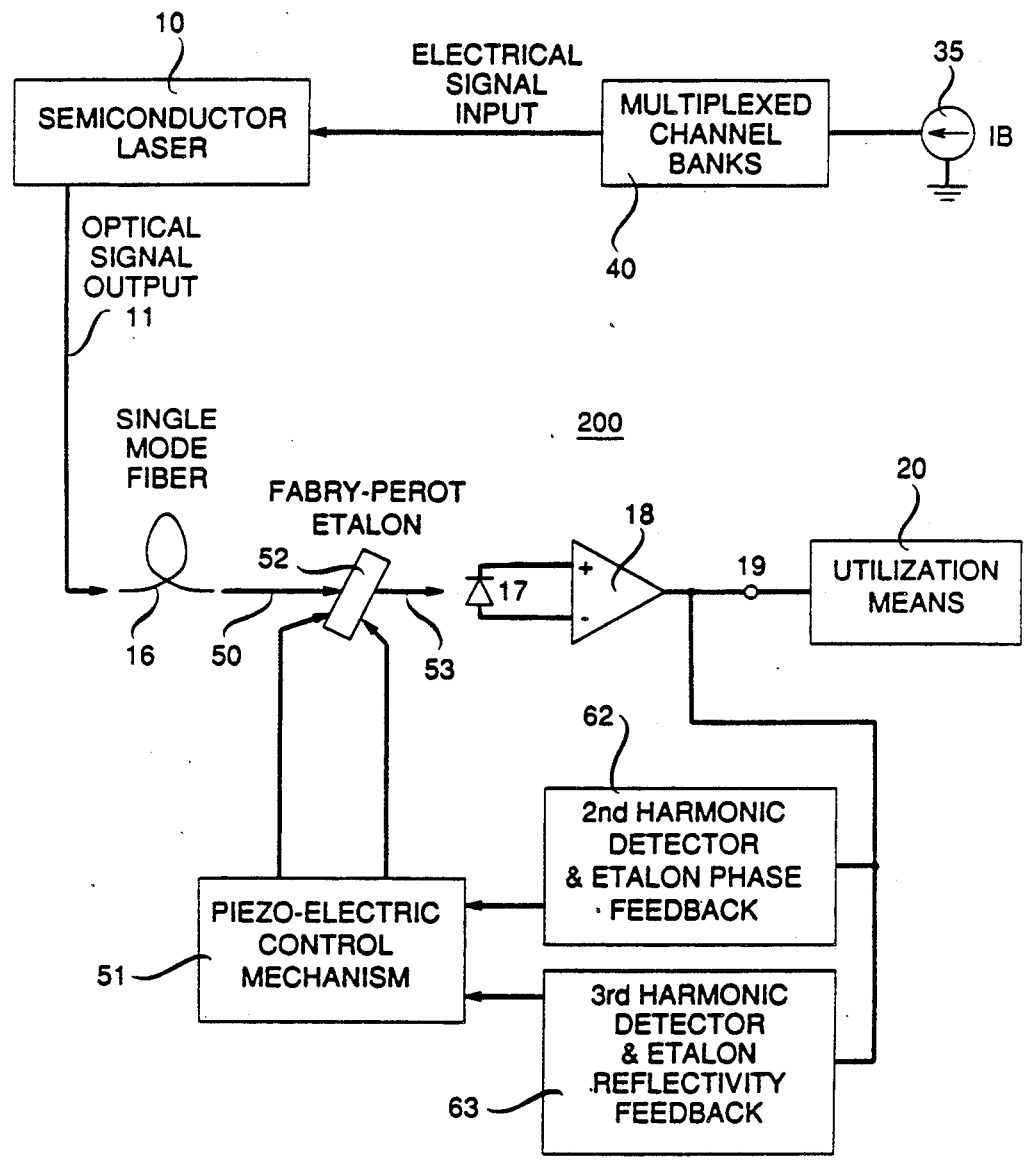

INTERFEROMETRIC DEVICES FOR REDUCING HARMONIC DISTORTIONS IN LASER COMMUNICATION SYSTEMS

TECHNICAL FIELD

This invention relates to optical communication systems and more particularly to optical transmission systems using modulated semiconductor injection lasers as optical signal sources.

BACKGROUND OF THE INVENTION

An analog or digital signal optical communication system typically uses a semiconductor injection laser whose optical output is modulated by varying the current injected into the laser (current injection modulation) in accordance with a modulating signal which represents information to be transmitted. The output is then transmitted over a transmission line, typically an optical fiber, to a receiver where the modulating signal is detected and the information is recovered and utilized. For example, such a system is usable in cable TV, satellite communication, and radar communication.

In order to make economical use of such a system, many different signals are simultaneously transmitted (multiplexed) over the same transmission line using the same laser. For this purpose, the laser typically is modulated by a plurality of subcarrier frequencies (frequency multiplexing) which are themselves either amplitude or frequency modulated (AM or FM) by a corresponding plurality of signals. However, either the inherent dispersive nonlinearity (if any) of response of the laser material to these electrical signals or the inherent nonlinearity of the response due to the nonlinear interferometric properties of the laser cavity, or both, gives rise to a resulting unavoidable overall nonlinearity of response of the laser. This overall nonlinearity in the laser response to electrical signals results in a generation of undesirable harmonics of the signals. Furthermore, wavelength chirping of the modulated laser, coupled with the non-linear transmission characteristics of any dispersive element located along the transmission line, will also give rise to harmonic distortion and hence undesirable intermodulation between the different frequency-multiplexed signals, whereby unwanted harmonic distortion and unwanted intermodulation distortion (cross-talk) occur, respectively.

In prior art, in order to minimize the aforementioned undesirable distortions, workers in the art have selected the operating DC bias current of the laser such that, when the modulating signals are all zero, the laser operates at the center of its most nearly linear range (region-)—i.e., the region where the intensity of optical output of the laser is most nearly a linear function of current applied to the laser (maximum linearity region). To this end, various electrical feedback schemes have been taught to ensure that the laser operates with a DC bias current in this linear range, so that the second harmonic distortion is minimized. That is, for example, by means of filters and feedback the second harmonic in the optical output of the laser (in response to a test signal applied to the laser) is detected and a correction signal for the DC bias current is fed back to adjust the DC bias current to minimize this second harmonic distortion. Such a scheme is taught, for example, in U.S. Pat. No. 4,101,847, issued to A. Albanese on July 18, 1978, entitled "Laser Control Circuit." Although such an approach is useful for minimizing the second harmonic distortion generated in the laser, it does not minimize undesirable higher harmonics, and it also does not eliminate harmonic distortion generated along the transmission line.

SUMMARY OF THE INVENTION

In a semiconductor injection laser which exhibits wavelength chirp and is used as the optical source in an optical communication system, second and third harmonic distortions are simultaneously minimized by means of second and third harmonics generated by an optical interferometric device, such as a Fabry-Perot etalon, located in the path of the optical output of the laser. Advantageously, this etalon has a relatively low reflectivity, namely, less than about 10%. In this way, nonlinearities in the etalon compensate the nonlinearities in the laser, both as to the second and the third order nonlinearities. The optical parameters of the interferometric device are selected (and varied during operation if need be), in conjunction with a selection of a DC bias current of the laser, that minimize simultaneously both the second harmonic distortion and the third harmonic distortion. These interferometer device parameters include the optical phase $\phi$ and the reflectivity r of the device. In the case of a Fabry-Perot etalon device, for example, this optical phase $\phi$ is proportional to $nd \cos \theta / \lambda$, i.e., the product of the reflective index n, thickness d, and cosine of the angle of incidence $\cos \theta$ divided by the vacuum wavelength $\lambda$ of the optical beam. Thus for a given wavelength $\lambda$, the phase $\phi$ can be varied by varying the thickness d or the angle of incidence $\theta$ or the refractive index n. The reflectivity r is the (optical intensity or power) reflection coefficient of each face of a Fabry-Perot.

BRIEF DESCRIPTION OF THE DRAWING

This invention, together with its features and advantages, may be better understood when read in conjunction with the drawing in which FIG. 2 is a schematic diagram of another optical communication system in accordance with another specific embodiment of the invention.

A major difference between FIG. 1 and FIG. 2 is the placement of the Fabry-Perot etalon at the sending versus the receiving end of the system.

Elements that are essentially the same in FIGS. 1 and 2 are labeled with the same reference numerals.

DETAILED DESCRIPTION

Figure 1:
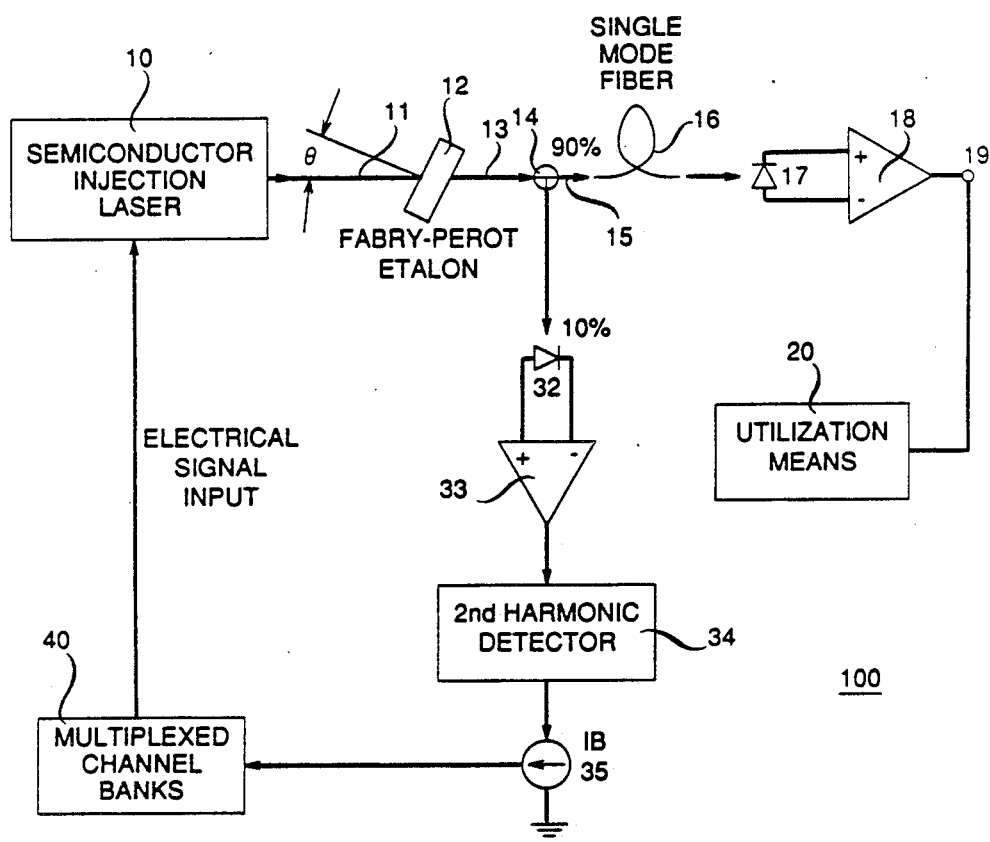
FIG. 1 is a schematic diagram of an optical communication system in accordance with a specific embodiment of the invention.

As shown in FIG. 1, in an optical communication system 100 a semiconductor injection laser 10 emits a modulated optical beam 11 that is modulated, typically in accordance with analog amplitude or frequency modulation signals, by multiplexed signal channel banks 40, as known in the art. The modulated beam 11 propagates through a Fabry-Perot etalon 12 oriented at an angle $\theta$ with respect to the beam. After propagating through the etalon, a modulated beam 13 emerges and impinges upon a beam splitter 14, whereby most (typically about 90%) of the intensity of the beam 13 emerges as a modulated beam 15. This modulated beam 15 enters into a propagates through an optical fiber 16 to an optical detector 17, typically a photodiode detector. The electrical output of this photodiode detector is fed as input to an amplifier 18, typically an analog amplifier. The output of the amplifier 18 is fed to an output terminal 19 to which is connected a utilization means 20, i.e., circuitry and the like for using the information received in the output signals of the amplifier 18.

The remaining beam 31 produced by the beam splitter 14 (typically having about 10% of the intensity of the beam 13) is incident upon another optical detector 32 whose output is fed to another amplifier 33. The output terminal of this amplifier 33 is connected to a second harmonic detector 34 which controls a DC bias source 35. In turn, the DC bias source 35 supplies a DC bias current IB to the laser 10.

The parameters of the Fabry-Perot 12 are selected in conjunction with the DC bias current IB to minimize second and third harmonic distortion, in the absence of signal from the harmonic detector 34, either by trial and error or by calculation as shown in the Appendix below, or by such calculation supplemented (fine-tuned) by trial and error.

During laser operation, any second harmonic component (with respect to the modulating signals supplied by the channel banks 40) which may be detected by the detector 34 represents distortion due to uncontrolled perturbations in the system, and therefore the DC bias is then adjusted by means of the detector 34 to reduce this second harmonic in accordance with the principle of negative feedback or by visual or other trial and error adjustment.

In another embodiment of the invention, as shown in FIG. 2, in an optical communication system 200 the optical beam 11 from the laser 10 enters into and propagates through the fiber 16. Upon emerging from the fiber as optical beam 50, it is incident upon a Fabry-Perot etalon 52. In addition to having a variable orientation angle $\phi$ with respect the beam 51, the etalon 52 can also have a variable refraction index of refraction, variable spacing between opposite faces, or a variable angle of orientation (non-parallelism) of opposing faces (to vary the reflectivity, if need be), or any combination of the variable parameters. The spacing and orientation of faces can be controlled, for example, by using piezoelectric material located between the faces of the etalon controlled by a piezo-electric control mechanism 51, as known in the art. The optical beam 53 emerging from the etalon 52 is incident upon the detector 17, which produces an electrical signal that is amplified by the amplifier 18.

During operation, a second harmonic detector 62 detects second harmonic component (with respect to the signals supplied by the channel banks 40) in the output of the amplifier 18, and it feeds back a signal to the piezo-electric control mechanism 51 to change the phase $\phi$ of the etalon 52, in order to reduce this second harmonic in the output, in accordance with the principle of negative feedback or by trial and error. At the same time, if need be, a third harmonic detector 63 detects third harmonic component in the output of the amplifier 18 and feeds back a signal to the piezo-electric control mechanism 51 to change the orientation (non-parallelism) of the opposing etalon faces and thus to change the finesse, such by changing the reflectivity, of these faces, in order to reduce this third harmonic distortion, in accordance with the principle of negative feedback or by trial and error.

In a typical example (FIG. 1) by way of illustration only, the laser 10 is a p-n junction indium gallium arsenic phosphide distributed feedback injection laser which is coupled into a short section of single mode fiber (not shown) via an optical isolator (not shown). Another short section of fiber (not shown) is used to couple the optical beam into the detector 32 via another optical (not shown), to avoid etalon interference effects between the ends of these two short fibers. The wavelength of light emitted by the laser is equal to about 1.3 micrometers. The DC bias current is between about 40 and 41 milliamp. The laser has a modulation chirp per unit of about 325 Megahertz/milliamp, and a DC chirp of about 1.7 Gigahertz/milliamp. The modulation current is about 21 milliamp peak-to-peak at a frequency of about 225 Megahertz. The nonlinearity of response factor $\delta$ (see Appendix below) is about 0.003/milliamp. Finally, the Fabry-Perot etalon has a Free Spectral Range (FSR=c/2nd cos $\theta$) of about $2.88 \times 10^{18}$ per sec (or $1.16 \times 10^{-8}$ cm), and a reflectivity r of about 3 percent. The measured improvement in the second harmonic distortion was at least about 20 dB, while the third harmonic distortion remained below that of the second.

APPENDIX

The power (intensity) output $P_0$ from a modulated semiconductor laser with a nonlinear power-current relationship can be written:

$$P_0 = k \cdot I \cdot (1 - \delta \cdot I) \tag{1}$$

where k in a constant, I is the laser drive current (bias plus signal), and $\delta$ is the nonlinearity of response factor. For the case in which the laser is amplitude modulated at frequency f, and in which the drive current I composed of a bias current $I_b$ above threshold and a signal current with a peak-to-peak value $I_m$:

$$I = I_b \cdot \left[ 1 + \frac{I_m}{2I_b} \sin(2\pi ft) \right] \tag{2}$$

On the other hand, the transmission function F of a Fabry-Perot etalon having a low reflectivity is approximately given by:

$$F = 1 + \frac{R}{2} \sin\left[ \frac{2\pi\lambda}{FSR} + \phi_0 \right] \tag{3}$$

where R is the ripple ($= 1 - P_{MIN}/P_{MAX}$) of the etalon.

Taking into account that the laser wavelength depends upon temperature and output power, and hence upon laser drive current, the transmission function $F = P/P_0$ of a low reflectivity Fabry-Perot etalon can be written as:

$$F = 1 + \frac{R}{2} \cdot \sin\left[ \frac{\pi \beta I_m}{FSR} \cdot \sin(2\pi ft) + \frac{2\pi \beta_{dc}}{FSR} \cdot I_b + \phi_0 \right] \tag{4}$$

where $\beta_{dc}$ is the lasing wavelength shift per unit change in dc bias current, $\beta$ is the modulation induced chirp per unit modulation current, and $\phi_0$ is an arbitrary phase which depends upon the optical thickness of the etalon, among things. Noting that the optical power P emerging after propagation through the etalon is given by $P = P_0 F$, and combinings eqs. (1), (2), and (4), the following expression is obtained for the optical power after passing through the etalon:

$$P = k \cdot \left\{ \left[ 1 + \frac{R}{2} \cdot \sin\left[ \frac{\pi \beta I_m}{FSR} \cdot \sin(2\pi ft) + \frac{2\pi \beta_{bc}}{FSR} I_b + \phi_0 \right] \right] \cdot \left[ 1 + \frac{I_m}{2I_b} \cdot \sin(2\pi ft) \right] \cdot I_b - \delta \left[ 1 + \frac{R}{2} \cdot \sin\left[ \frac{\pi \beta I_m}{FSR} \cdot \sin(2\pi ft) + \frac{2\pi \beta_{bc}}{FSR} I_b + \phi_0 \right] \right] \left[ 1 + \frac{I_m}{2I_b} \cdot \sin(2\pi ft) \right]^2 \cdot I_b^2 \right\} \quad (5)$$

Equation 5 is a highly nonlinear function of frequency f, giving rise to the harmonic distortions. A Bessel function expansion of this expression yields the following expressions for the fundamental component $S_f$, the second order harmonic component $S_{2f}$, and third order harmonic component $S_{3f}$, respectively:

$$S_f: \frac{I_m}{2} + R \cdot I_b \cdot J_1(\gamma)\cos\phi + \frac{R}{4} \cdot I_m \cdot (J_0(\gamma) - J_2(\gamma))\sin\phi - \delta \cdot I_b^2 \cdot \left[ \frac{I_m}{I_b} + R \cdot J_1(\gamma)\cos\phi + \frac{R}{2} \cdot \frac{I_m}{I_b} (J_0(\gamma) - J_2(\gamma))\sin\phi + \frac{R}{16} \frac{I_m^2}{I_b^2} [3J_1(\gamma) - J_3(\gamma)]\cos\phi \right] \quad (6)$$

$$S_{2f}: R \cdot I_b \cdot J_2(\gamma)\sin\phi - \frac{R}{4} \cdot I_m(J_1(\gamma) - J_3(\gamma))\cos\phi - \delta \cdot I_b^2 \cdot \left[ -\frac{I_m^2}{8I_b^2} + R \cdot J_2(\gamma)\sin\phi - \frac{R \cdot I_m}{2I_b}(J_1(\gamma) - J_3(\gamma))\cos\phi - \frac{R \cdot I_m^2}{8I_b^2} \cdot \left( \frac{J_0(\gamma)}{2} - J_2(\gamma) + \frac{J_4(\gamma)}{2} \right)\sin\phi \right] \quad (7)$$

$$S_{3f}: R \cdot I_b \cdot J_3(\gamma)\cos\phi + \frac{R}{4} \cdot I_m(J_2(\gamma) - J_4(\gamma))\sin\phi - \delta \cdot I_b^2 \cdot \left[ R \cdot J_3(\gamma)\cos\phi + \frac{R \cdot I_m}{2I_b}(J_2(\gamma) - J_4(\gamma))\sin\phi - \frac{R \cdot I_m^2}{8I_b^2}\left( \frac{J_1(\gamma)}{2} - J_3(\gamma) \right)\cos\phi \right] \quad (8)$$

with $\gamma = \frac{\pi \cdot \beta \cdot I_m}{FSR}$

The second and harmonic terms, as given above and as confirmed by experiment, have a natural tendency to be in counterphase with respect to each other as the bias current $I_b$ is varied. That is, for example, when the second harmonic component $S_{2f}$ is near a minimum (sin $\phi = 0$), the third order component $S_{3f}$ is near a maximum (cos $\phi = 1$). By judicious choice of parameters of the Fabry-Perot, it is possible to break this counterphase tendency and thus minimize simultaneously both the second and the third harmonic components; that is, simultaneously to make $S_{2f} = S_{3f} = 0$.

Mathematically the desired parameters can be calculated, assuming $\delta$ is nonzero, by first solving eq. 7($S_{2f}=0$) for R as a function of $\phi$, $I_m$, and $I_b$: $R = R(\phi, I_m, I_b)$. Next, select a convenient value of $I_m$, typically less than about 0.95 times an approximately expected value of $I_b$, so that R is obtainable as a function of $\phi$ and $I_b$: $R = R(I_b, \phi)$. Next, solve eq. 8($S_{3f}=0$) for $I_b$ as a function of $\phi$, noting that R cancels out; and then substitute this solution for $I_b$ in terms of $\phi$ into the previous $R = R(I_b, \phi)$ to obtain R as a function of $\phi$, $R = R(\phi)$, that is, to obtain Fabry-Perot etalon ripple as a function of etalon phase. The ripple R is related to the reflectivity r by $(1-R) = (1-r)^2/(1+r^2)$, which for a low reflectivity etalon reduces to $R = 4r$, so that in any event the reflectivity r thus can be calculated for a given etalon phase $\phi$. Note that since the etalon phase is given by $\phi = 4\pi nd \cos\theta/\lambda$, it follows that, for given wavelength $\lambda$ and etalon phase $\phi$, the product of n (refractive index), d (thickness), and $\cos\theta$ is thereby calculable to minimize simultaneously both the second and third harmonic distortions.

For the case where $\delta = 0$—i.e., an ideal (linear) laser—setting $S_{2f}=0$ in eq. 7 and $S_{3f}=0$ in eq. 8 yields two simultaneous equations for $\tan\phi$ which, to be consistent, require:

$$\left( \frac{I_b}{I_m} \right)^2 = \frac{(J_1(\gamma) - J_3(\gamma))(J_4(\gamma) - J_2(\gamma))}{16 J_2(\gamma) \cdot J_3(\gamma)} \quad (9)$$

It should be noted that eq. 9 thus is an exact solution for the case of a linear laser with zero second and third harmonic distortion in the output after passing through the Fabry-Perot etalon.

Although the invention has been described in detail in terms of specific embodiments, various modifications can be made without departing from the scope of the invention. For example, the parameters of the interferometric device, such as the Fabry-Perot etalon 52, can be selected and adjusted during operation to minimize not only the second or third harmonic distortion, or both, produced by the laser but also that, or those, produced by the fiber in addition to that, or those, produced by the laser. Finally, instead of a Fabry-Perot etalon, other interferometric devices can be used, such as a resonant optical amplifier.

We claim:
1. An optical transmission system comprising
   (a) a semiconductor injection laser which emits an optical beam which is modulated by means of signals applied to the laser, whereby the laser emits a modulated optical beam;
   (b) an optical interferometric device located in the path of the modulated beam so as to reduce harmonic distortion in the beam, the interferometric device being a Fabry-Perot etalon having opposing faces each with a reflectivity of less than about 10 percent.

2. The system of claim 1 in which the phase of the interferometric device is selected to minimize simultaneously second and third harmonic distortions, and in which the laser is a semiconductor injection laser.

3. The system of claim 2 further comprising an optical fiber located to receive and transmit optical radiation coming from the laser.

4. The system of claim 3 further comprising means for detecting light coming from the fiber.

5. The system of claim 3 further comprising means for detecting and utilizing the light coming from the fiber.

6. The system of claim 1 further comprising an optical fiber located to receive and transmit optical radiation coming from the laser.

7. The system of claim 6 further comprising means for detecting light coming from the fiber.

8. The system of claim 6 further comprising means for detecting and utilizing the light coming from the fiber.

* * * * *